United States Patent
Hwang et al.

(10) Patent No.: US 7,733,727 B2
(45) Date of Patent: Jun. 8, 2010

(54) RECEIVER CIRCUIT OF SEMICONDUCTOR MEMORY APPARATUS

(75) Inventors: Tae-Jin Hwang, Ichon (KR); Yong-Ju Kim, Ichon (KR); Hee-Woong Song, Ichon (KR); Ic-Su Oh, Ichon (KR); Hyung-Soo Kim, Ichon (KR); Hae-Rang Choi, Ichon (KR); Ji-Wang Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 140 days.

(21) Appl. No.: 12/172,108

(22) Filed: Jul. 11, 2008

(65) Prior Publication Data

US 2009/0059703 A1    Mar. 5, 2009

(30) Foreign Application Priority Data

Sep. 4, 2007    (KR) ...................... 10-2007-0089490

(51) Int. Cl.
*G11C 11/00* (2006.01)

(52) U.S. Cl. ...................................... 365/207; 365/191
(58) Field of Classification Search ................. 365/207, 365/191
See application file for complete search history.

(56) References Cited

U.S. PATENT DOCUMENTS

| | | | |
|---|---|---|---|
| 5,383,155 A * | 1/1995 | Ta ............................... | 365/191 |
| 6,301,180 B1 * | 10/2001 | Sudo et al. ................... | 365/207 |
| 7,093,145 B2 | 8/2006 | Werner et al. | |
| 7,124,221 B1 | 10/2006 | Zerbe et al. | |
| 7,126,408 B2 | 10/2006 | Zerbe | |
| 7,227,798 B2 * | 6/2007 | Gupta et al. ................ | 365/205 |
| 7,269,212 B1 | 9/2007 | Chau et al. | |

(Continued)

FOREIGN PATENT DOCUMENTS

JP    11027134    1/1999

(Continued)

*Primary Examiner*—Michael T Tran
(74) *Attorney, Agent, or Firm*—Baker & McKenzie LLP

(57) ABSTRACT

A receiver circuit is described herein, comprising a first data determining unit configured to detect and amplify a voltage level difference between first and second external data and generate first and second sense signals and to generate first internal data in response to the first and second sense signals, a first offset control unit configured to generate first and second offset signals in response to the first and second sense signals, the first and second offset signals swinging between a maximum voltage level and a minimum voltage level determined based on a first code, a second data determining unit configured to detect and amplify the voltage level difference between the first and second external data to generate third and fourth sense signals and to generate second internal data in response to the third and fourth sense signals; and a second offset control unit for generating third and fourth offset signals in response to the third and fourth sense signals, the third and fourth offset signals swinging between a maximum voltage level and a minimum voltage level determined based on a second code, wherein the first data determining unit is configured to determine setup time and hold time of the first internal data in response to the third and fourth offset signals, and wherein the second data determining unit is configured to determine setup time and hold time of the second internal data in response to the first and second offset signals.

9 Claims, 5 Drawing Sheets

U.S. PATENT DOCUMENTS

| | | | | |
|---|---|---|---|---|
| 7,286,428 B2 * | 10/2007 | Baker | ......................... | 365/207 |
| 7,355,914 B2 * | 4/2008 | Raszka | ....................... | 365/207 |
| 7,489,588 B2 * | 2/2009 | Hanzawa et al. | ........ | 365/233.18 |
| 7,505,343 B2 * | 3/2009 | Kang | ......................... | 365/205 |
| 2006/0256849 A1 | 11/2006 | Tseng et al. | | |

FOREIGN PATENT DOCUMENTS

| | | |
|---|---|---|
| JP | 11-317774 | 11/1999 |
| JP | 2003318726 | 11/2003 |
| KR | 1020070014242 | 2/2007 |

\* cited by examiner

RECEIVER CIRCUIT OF SEMICONDUCTOR MEMORY APPARATUS

CROSS-REFERENCES TO RELATED APPLICATION

The present application claims priority under 35 U.S.C. 119(a) to Korean application number 10-2007-0089490, filed in the Korean Intellectual Property Office on Sep. 4, 2007, which is incorporated by reference in its entirety as if set forth in full.

BACKGROUND

1. Technical Field

The embodiments herein relate to a semiconductor memory apparatus, and, more particularly, to a receiver circuit.

2. Related Art

A conventional receiver circuit of a semiconductor memory apparatus receives data from an external system, buffers the data, and delivers the data to an internal circuit of the semiconductor memory apparatus.

As shown in FIG. 1, a conventional receiver circuit includes first to fourth sense amplifiers 11, 12, 13, and 14, and first to fourth latch units 21, 22, 23, and 24. The first sense amplifier 11 detects and amplifies a voltage level difference between first external data signal 'Data+' and second external data signal 'Data−' to generate first and second sense signals 'SA_out1' and 'SA_outb1'. The first sense amplifier 11 operates in synchronization of a first clock signal 'CLK1'. The first latch unit 21 generates first internal data signal 'Data_int 1' in response to the first and second sense signals 'SA_out1' and 'SA_outb1'.

The second sense amplifier 12 detects and amplifies the voltage level difference between the first external data signal 'Data+' and the second external data signal 'Data−' to generate third and fourth sense signals 'SA_out2' and 'SA_outb2'. The second sense amplifier 12 operates in synchronization of a second clock signal 'CLK2'. The second latch unit 22 generates second internal data signal 'Data_int 2' in response to the third and fourth sense signals 'SA_out2' and 'SA_outb2'.

The third sense amplifier 13 detects and amplifies the voltage level difference between the first external data signal 'Data+' and the second external data signal 'Data−' to generate fifth and sixth sense signals 'SA_out3' and SA_outb3. The third sense amplifier 13 operates in synchronization of a third clock signal 'CLK3'. The third latch unit 23 generates second internal data signal 'Data_int 3' in response to the fifth and sixth sense signals 'SA_out3' and SA_outb3.

The fourth sense amplifier 14 detects and amplifies the voltage level difference between the first external data signal 'Data+' and the second external data signal 'Data−' to generate seventh and eighth sense signals 'SA_out4' and 'SA_outb4'. The fourth sense amplifier 14 operates in synchronization of a fourth clock signal 'CLK4'. The first to fourth clock signals 'CLK1' to 'CLK4' have a phase difference of 90°. The fourth latch unit 24 generates fourth internal data signal 'Data_int 4' in response to the seventh and eighth sense signals 'SA_out4' and 'SA_outb4'.

The receiver circuit having the above structure can determine four data during one period of a clock signal. However, the first to fourth sense amplifiers 11, 12, 13, and 14 must detect and amplify the voltage difference of the first and second external data signals 'Data+' and 'Data−' during ¼ period of a clock signal.

As a data rate is gradually increased, a clock frequency is also increased. Accordingly, as the clock frequency is increased, the operational time of the sense amplifiers 11, 12, 13, and 14 constituting the typical receiver shown in FIG. 1 is reduced. Therefore, a technology of ensuring an operation margin of such a receiver is necessary. If the operation margin of the receiver is not ensured, then the receiver may operate erroneously.

SUMMARY

A receiver circuit of a semiconductor memory apparatus, capable of processing data at a high speed while ensuring the operation margin of the receiver circuit is described herein.

According to one aspect, the receiver circuit can comprise a first data determining unit configured to detect and amplify a voltage level difference between first and second external data, to generate first and second sense signals, and to generate first internal data in response to the first and second sense signals, a first offset control unit configured to generate first and second offset signals in response to the first and second sense signals, the first and second offset signals configured to swing between a maximum voltage level and a minimum voltage level determined based on a first code, a second data determining unit configured to detect and amplify the voltage level difference between the first and second external data, to generate third and fourth sense signals, and to generate second internal data in response to the third and fourth sense signals, and a second offset control unit configured to generate third and fourth offset signals in response to the third and fourth sense signals, the third and fourth offset signals configured to swing between a maximum voltage level and a minimum voltage level determined based on a second code, wherein the first data determining unit is configured to determine setup time and hold time of the first internal data in response to the third and fourth offset signals, and wherein the second data determining unit is configured to determine setup time and hold time of the second internal data in response to the first and second offset signals.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
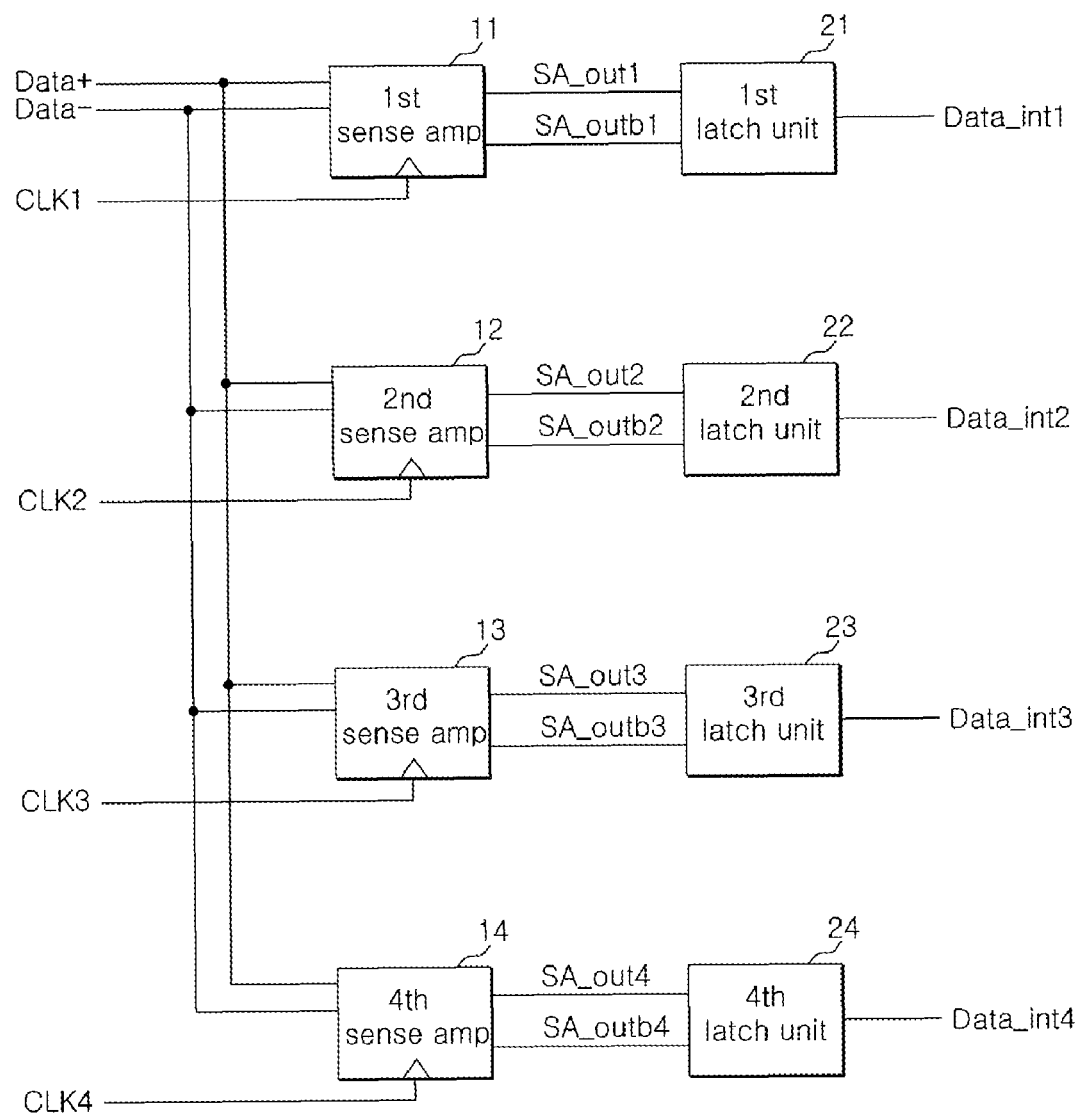
FIG. 1 is a block diagram showing a receiver circuit of a conventional semiconductor memory apparatus.
Figure 2:
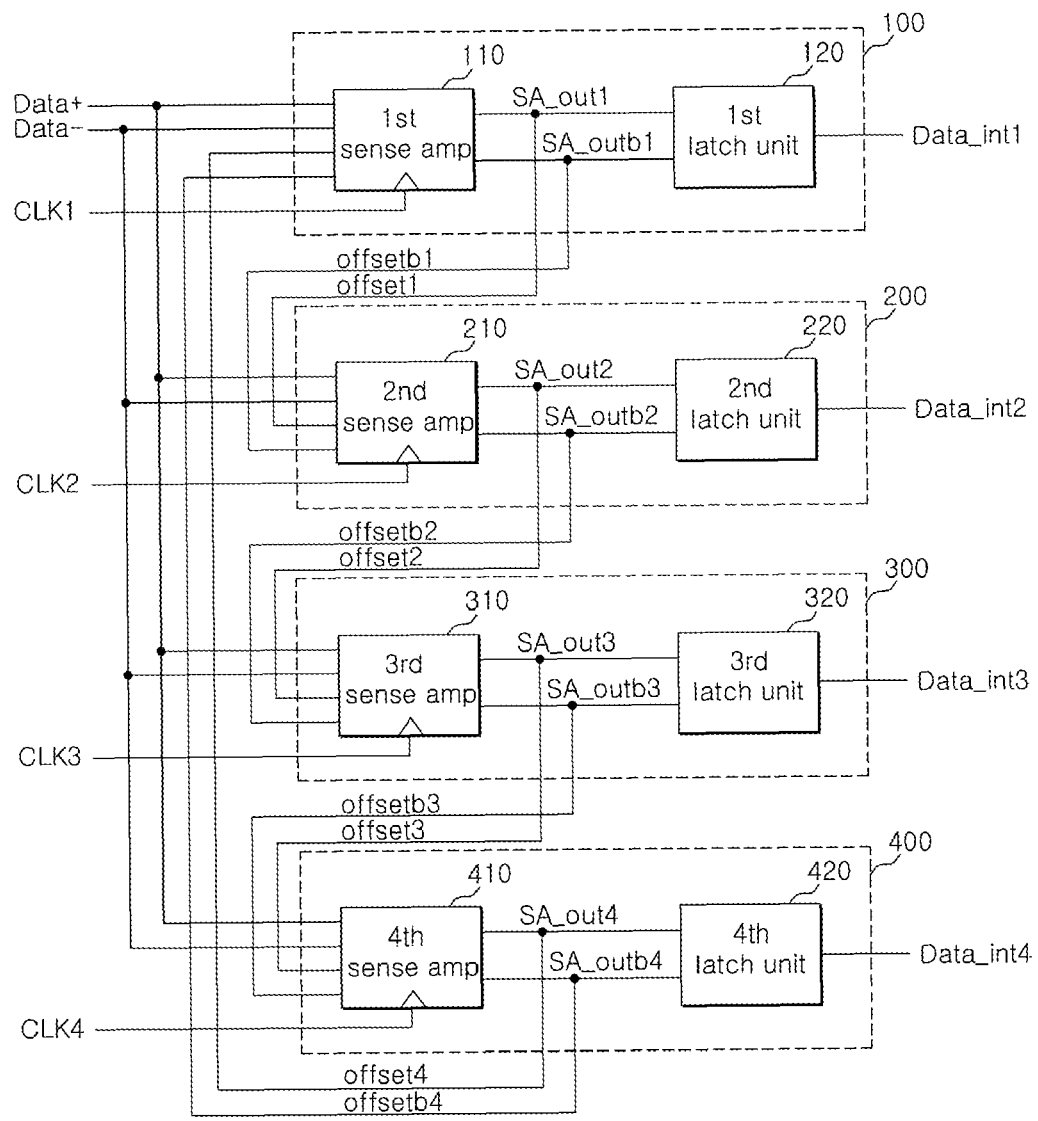
FIG. 2 is a block diagram showing a receiver circuit of a semiconductor memory apparatus according to an embodiment herein.

FIG. 2 is a block diagram showing a receiver circuit 500 of a semiconductor memory apparatus according to an embodiment herein. Referring to FIG. 2, the receiver circuit 500 can include a first data determining unit 100, a second data determining unit 200, a third data determining unit 300, and a fourth data determining unit 400.

The first data determining unit 100 can includes a first sense amplifier 110 and a first latch unit 120. The first sense amplifier 110 can detect and amplify a voltage level difference between first external data signal 'Data+' and second external data signal 'Data−' in response to a first clock signal 'CLK1' and can generate a first sense signal 'SA_out1' and a second sense signal 'SA_outb1'.

The first latch unit 120 can generate first internal data signal 'Data_int1' in response to the first and second sense signals 'SA_out1' and 'SA_outb1'. For example, if the first sense signal 'SA_out1' is enabled at a high level, and the second sense signal 'SA_outb1' is disabled at a low level, then the first latch unit 120 can output the first internal data signal 'Data_int1' having a high level. In addition, if the first sense signal 'SA_out1' is disabled at a low level, and the second sense signal 'SA_outb1' is enabled at a high level, then the first latch unit 120 can output the first internal data signal 'Data_int1' having a low level.

The second data determining unit 200 can include a second sense amplifier 210 and a second latch unit 220. The second sense amplifier 210 can detect and amplify the voltage level difference between the first external data signal 'Data+' and the second external data signal 'Data−' in response to a second clock signal 'CLK2' and can generate a third sense signal 'SA_out2' and a fourth sense signal 'SA_outb2'.

The second latch unit 220 can generate the second internal data signal 'Data_int2' in response to the third and fourth sense signals 'SA_out2' and 'SA_outb2'. For example, if the third sense signal 'SA_out2' is enabled at a high level, and the fourth sense signal 'SA_outb2' is disabled at a low level, then the second latch unit 220 can output the second internal data signal 'Data_int2' having a high level. In addition, if the third sense signal 'SA_out2' is disabled at a low level, and the fourth sense signal 'SA_outb2' is enabled at a high level, then the second latch unit 220 can output the second internal data signal 'Data_int2' having a low level.

The third data determining unit 300 can include a third sense amplifier 310 and a third latch unit 320. The third sense amplifier 310 can detect and amplify the voltage level difference between the first external data signal 'Data+' and the second external data signal 'Data−' in response to a third clock signal 'CLK3' and can generate a fifth sense signal 'SA_out3' and a sixth sense signal 'SA_outb3'.

The third latch unit 320 can generate the third internal data signal 'Data_int3' in response to the fifth and sixth sense signals 'SA_out3' and SA_outb3. For example, if the fifth sense signal 'SA_out3' is enabled at a high level, and the sixth sense signal 'SA_outb3' is disabled at a low level, then the third latch unit 320 can output the third internal data signal 'Data_int3' having a high level. In addition, if the fifth sense signal 'SA_out3' is disabled at a low level, and the sixth sense signal 'SA_outb3' is enabled at a high level, then the third latch unit 320 can output the third internal data signal 'Data_int3' having a low level.

The fourth data determining unit 400 can include a fourth sense amplifier 410 and a fourth latch unit 420. The fourth sense amplifier 410 can detect and amplify the voltage level difference between the first external data signal 'Data+' and the second external data signal 'Data−' in response to a fourth clock signal 'CLK4' and can generate a seventh sense signal 'SA_out4' and an eighth sense signal 'SA_outb4'.

The fourth latch unit 420 can generate the fourth internal data signal 'Data_int4' in response to the seventh and eighth sense signals 'SA_out4' and 'SA_outb4'. For example, if the seventh sense signal 'SA_out4' is enabled at a high level, and the eighth sense signal 'SA_outb4' is disabled at a low level, then the fourth latch unit 420 can output the fourth internal data signal 'Data_int4' having a high level. In addition, if the seventh sense signal 'SA_out4' is disabled at a low level, and the eighth sense signal 'SA_outb4' is enabled at a high level, then the fourth latch unit 420 can output the fourth internal data signal 'Data_int4' having a low level.

In this case, the first and second sense signals 'SA_out1' and 'SA_outb1' are supplied to the second sense amplifier 210 as first and second offset signals 'offset1' and 'offsetb1'. The third and fourth sense signals 'SA_out2' and 'SA_outb2' are supplied to the third sense amplifier 310 as third and fourth offset signals 'offset2' and 'offsetb2'. The fifth and sixth sense signal 'SA_out3' and 'SA_outb3' are provided to the fourth sense amplifier 410 as fifth and sixth offset signals 'offset3' and 'offsetb3'. The seventh and eighth sense signals 'SA_out4' and 'SA_outb4' are supplied to the first sense amplifier 110 as seventh and eighth offset signals 'offset4' and 'offsetb4'. In addition, a phase difference of 90° can exist between the first and second clock signals 'CLK1' and 'CLK2', the second and third clock signals 'CLK2' and 'CLK3', and the third and fourth clock signals 'CLK3' and 'CLK4'.

The first to fourth sense amplifiers 110, 210, 310, and 410 can have the same internal structure except for input signals and output signals. Accordingly, hereinafter, only the structure of the first sense amplifier 110 will be representatively described, and details of the second to fourth sense amplifiers 210, 310, and 410 will be omitted.

Figure 3:
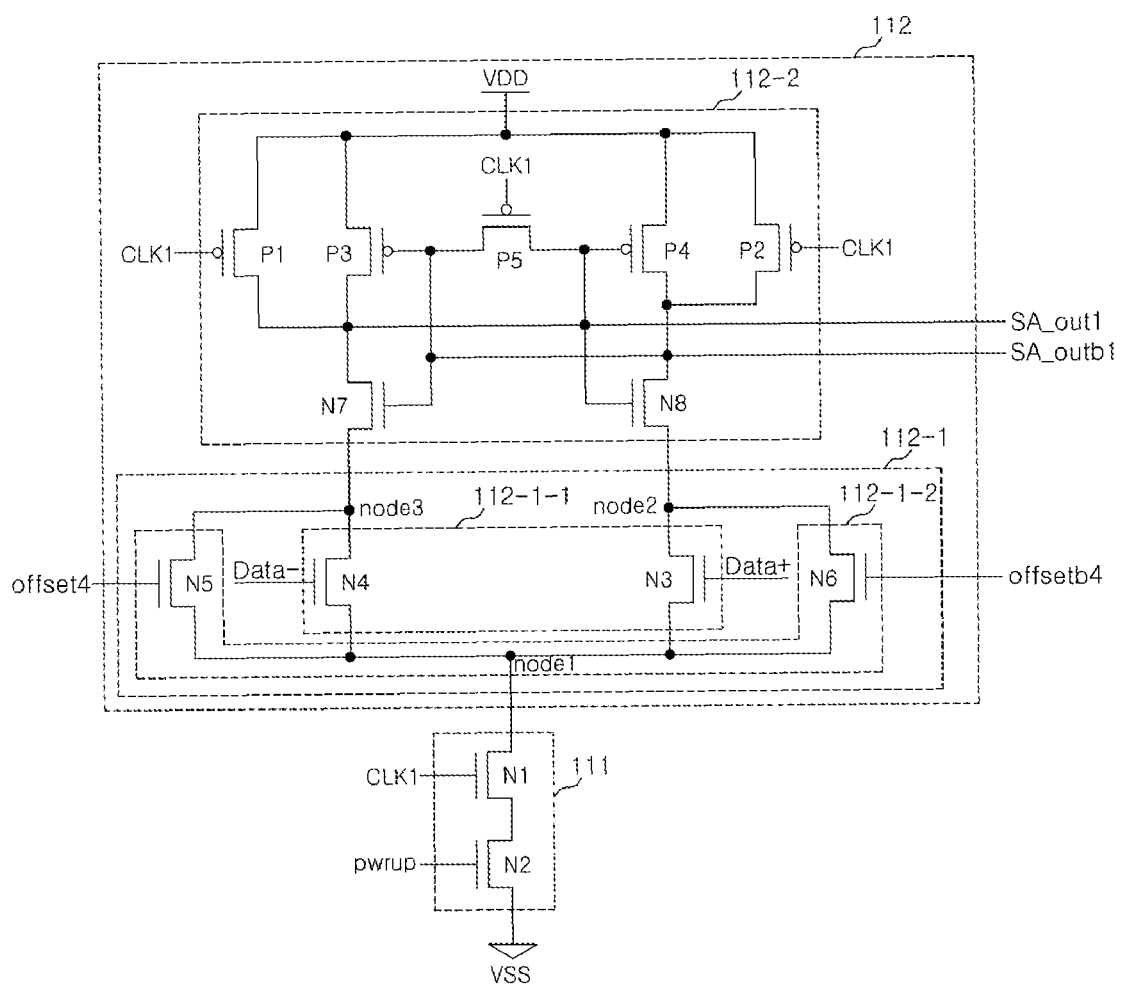
FIG. 3 is a detailed circuit diagram showing a first sense amplifier that can be included in the circuit of FIG. 2.

FIG. 3 is a detailed circuit diagram showing a first sense amplifier that can be included in the circuit of FIG. 2. As shown in FIG. 3, the first sense amplifier 110 can include a driving unit 111 and an input amplifying unit 112. The driving unit 111 can activate the input amplifying unit 112 in response to a power-up signal 'pwrup' and the first clock signal 'CLK1'. In other words, if the power-up signal 'pwrup' is enabled at a high level, and the first clock signal 'CLK1' becomes a high level, then the driving unit 111 can connect a grounding terminal VSS to a first node node1 of the input amplifying unit 112.

The driving unit 111 can include first and second transistors N1 and N2. The first transistor N1 can have a drain connected to the first node node1, and a gate which can receive the first clock signal 'CLK1'. The second transistor N2 can have a drain connected to a source of the first transistor N1, a gate which can receive the power-up signal 'pwrup', and a source which can be connected to the grounding terminal VSS.

If the input amplifying unit 112 is activated, that is, if the grounding terminal VSS is connected to the first node node1, then the input amplifying unit 112 can generate the first and second sense signals 'SA_out1' and 'SA_outb1' in response to the first and second external data signals 'Data+' and 'Data−', and the seventh and eight offset signals 'offset4' and 'offsetb4'.

The input amplifying unit 112 can include an input unit 112-1 and an amplifying unit 112-2. The input unit 112-1 can lower voltage levels of a second node node2 and a third node node3 due to a voltage level difference between the first and second external data signals 'Data+' and 'Data−' and a voltage level difference between the seventh and eighth offset signals 'offset4' and 'offsetb4'. For example, if a voltage level of the first external data signal 'Data+' is higher than a voltage level of the second external data signal 'Data−', then the input unit 112-1 can lower the voltage level of the second node node2. If the voltage level of the second external data signal 'Data−' is higher than the voltage level of the first external data signal 'Data+', then the input unit 112-1 can lower the voltage level of the third node node3. In addition, if a voltage level of the eighth offset signal 'offsetb4' is higher than a voltage level of the seventh offset signal 'offset4', then the input unit 112-1 can lower the voltage level of the second node node2. If the voltage level of the seventh offset signal 'offset4' is higher than the voltage level of the eighth offset signal 'offsetb4', then the input unit 112-1 can lowers the voltage level of the third node node3.

The input unit 112-1 can include a data input unit 112-1-1 and an offset input unit 112-1-2. The data input unit 112-1-1 can lower the voltage level of the second node node2 or the third node node 3 in response to the voltage level difference between the first and second external data signals 'Data+' and 'Data−'. For example, if the voltage level of the first external data signal 'Data+' is higher than the voltage level of the second external data signal 'Data−', then the data input unit 112-1-1 can lower the voltage level of the second node node2. If the voltage level of the second external data signal 'Data−' is higher than the voltage level of the first external data signal 'Data+', then the data input unit 112-1-1 can lower the voltage level of the third node node3.

The data input unit 112-1-1 can include third and fourth transistors N3 and N4. The third transistor N3 can have a gate receiving the first external data signal 'Data+', a drain connected to the second node node2, and a source connected to the first node node1. The fourth transistor N4 can include a gate which can receive the second external data signal 'Data−', a drain connected to the third node node3, and a source connected to the first node node1.

The offset input unit 112-1-2 can lower the voltage level of the second node node2 or the third node node3 in response to the voltage level difference between the seventh and eighth offset signals 'offset4' and 'offsetb4'. For example, if the voltage level of the eighth offset signals 'offsetb4' is higher than the voltage level of the seventh offset signal 'offset4', then the offset input unit 112-1-2 can lower the voltage level of the second node node2. If the voltage level of the seventh offset signal 'offset4' is higher than the voltage level of the eighth offset signals 'offsetb4', then the offset input unit 112-1-2 can lower the voltage level of the third node node3.

The offset input unit 112-1-2 can include fifth and sixth transistors N5 and N6. The fifth transistor N5 can have a gate receiving the seventh offset signal 'offset4', a drain connected to the third node node3, and a source connected to the first node node1. The sixth transistor N6 can include a gate configured to receive the eighth offset signals 'offsetb4', a drain connected to the second node node2, and a source connected to the first node node1.

The amplifying unit 112-2 can generate the first and second sense signals 'SA_out1' and 'SA_outb1' in response to the voltage level of the second node node2 or the third node node3. For example, if the voltage level of the second node node2 is lowered, then the amplifying unit 112-2 can enable the first sense signal 'SA_out1' at a high level, and can disable the second sense signal 'SA_outb1' at a low level. If the voltage level of the third node node3 is lowered, then the amplifying unit 112-2 can disable the first sense signal 'SA_out1' at a low level, and enable the second sense signal 'SA_outb1' at a high level.

The amplifying unit 112-2 can include seventh to thirteenth transistors N7, N8, and P1 to P5. The seventh transistor N7 can have a source connected to the third node node3. The eighth transistor N8 has a source connected to the second node node2. The ninth transistor P1 has a gate receiving the first clock signal 'CLK1', a source receiving an external voltage VDD, and a drain connected to a drain of the seventh transistor N7. The tenth transistor P2 can have a gate configured to receive the first clock signal 'CLK1', a source configured to receive the external voltage VDD, and a drain connected to a drain of the eighth transistor N8. The eleventh transistor P3 can have a gate connected to a gate of the seventh transistor N7, a source configured to receive the external voltage VDD, and a drain connected to a node linking the drain of the seventh transistor N7 with the ninth transistor P1. The twelfth transistor P4 can have a gate connected to a gate of the eighth transistor N8, a source configured to receive the external voltage VDD, and a drain connected to the drain of the eighth transistor N8. The thirteenth transistor P5 can have a gate configured to receive the first clock signal 'CLK1', and a drain and a source connected to the gate of the eleventh transistor P3 and the gate of the twelfth transistor P4, respectively. In this case, a node linking the drain of the seventh transistor N7 with the drain of the eleventh transistor P3 can be connected to a node linking the gate of the eighth transistor N8 with the twelfth transistor P4, and the first sense signal 'SA_out1' can be output from a node linking the gate of the eighth transistor N8 with the gate of the twelfth transistor P4. In addition, a node linking the gate of the seventh transistor N7 with the gate of the eleventh transistor P3 can be connected to a node linking the drain of the eighth transistor N8 with the drain of the twelfth transistor P4, and the second sense signal 'SA_outb1' can be output from a node linking the drain of the eighth transistor N8 with the drain of the twelfth transistor P4.

Therefore, when the first clock signal 'CLK1' becomes a high level, the first sense amplifier 110 can detect and amplify the voltage level difference of the first and second external data signals 'Data+' and 'Data−' and can generate the first and second sense signals 'SA_out1' and 'SA_outb1'. In more detail, if the first external data signal 'Data+' has a voltage level higher than the voltage level of the second external data signal 'Data−', and if the voltage level of the second node node2 becomes lowered, that is, a voltage level of the source of the eighth transistor N8 becomes lowered, then voltage level difference between the gate and source (gate-source voltage level difference) of the eighth transistor N8 can increase. In addition, if the gate-source voltage level difference of the eighth transistor N8 exceeds a threshold voltage of the eighth transistor N8, then the eighth transistor N8 can be turned on. At this time, if the eighth offset signal 'offsetb4' is input at a high level, then the sixth transistor N6 is turned on, such that the eighth transistor N8 can be turned on within a shorter time than a case in which the eight offset signal 'offsetb4' has a low level. When the eighth transistor N8 constituting the amplifying unit 112-2 is turned on, the first sense signal 'SA_out1' can be enabled at a high level, and the second sense signal 'SA_outb1' can be disabled at a low level. As a result, when the first external data signal 'Data+' has a voltage level higher than the voltage level of the second external data signal 'Data−', and the eighth offset signal 'offsetb4' becomes a high level, the first sense amplifier 110 can enable the first sense signal 'SA_out1' at a high level and disable the second sense signal 'SA_outb1' at a low level within a shorter time than a case in which the first external data signal 'Data+' has a voltage level higher than the voltage level of the second external data signal 'Data−', and the eighth offset signal 'offsetb4' can become a low level. In this case, the seventh offset signal 'offset4' can have a level opposite to a level of the eighth offset signal 'offsetb4'.

Meanwhile, if the second external data signal 'Data−' has a voltage level higher than the voltage level of the first external data signal 'Data+', then the voltage level of the third node node3 becomes lowered, that is, a voltage level of the source of the seventh transistor N7 can lower. Accordingly, the voltage level difference between the gate and source (gate-source voltage level difference) of the seventh transistor N7 becomes increased. In addition, if the gate-source voltage level difference of the seventh transistor N7 exceeds a threshold voltage of the seventh transistor N7, then the seventh transistor N7 can be turned on. At this time, if the seventh offset signal 'offset4' is input at a high level, then the fifth transistor N5 can be turned on, such that the seventh transistor N7 can be turned on within a shorter time than a case in which the seventh offset signal 'offset4' has a low level. If the seventh transistor N7, constituting the amplifying unit 112-2, is turned on, then the second sense signal 'SA_outb1' can be enabled at a high level, and the first sense signal 'SA_out1' can be disabled at a low level. As a result, when the second external data signal 'Data−' has a voltage level higher than the voltage level of the first external data signal 'Data+', and the seventh offset signal 'offset4' becomes a high level, the first sense amplifier 110 can enable the second sense signal 'SA_outb1' at a high level and disables the first sense signal 'SA_out1' at a low level within a shorter time than the case in which the second external data signal 'Data−' has a voltage level higher than the voltage level of the first external data signal 'Data+', and the seventh offset signal 'offset4' can transition to a low level. In this case, the eighth offset signal 'offsetb4' can have a level opposite to a level of the seventh offset signal 'offset4'.

On the assumption that the first external data signal 'Data+' has a voltage level higher than the voltage level of the second external data signal 'Data−', the first sense amplifier 110 can generate the first and second sense signals 'SA_out1' and 'SA_outb1' in the case of the eighth offset signal 'offsetb4' having a high level within a shorter time than a case of the eighth offset signal 'offsetb4' having a low level. In addition, on the assumption that the second external data signal 'Data1−' has a voltage level higher than the voltage level of the first external data signal 'Data+', the first sense amplifier 110 can generate the first and second sense signals 'SA_out1' and 'SA_outb1' within a shorter time in the case in which the seventh offset signal 'offset4' has a high level than in the case in which the seventh offset signal 'offset4' has a low level. In this case, the seventh and eighth offset signals 'offset4' and 'offsetb4' have been output from the fourth sense amplifier 410, and generated due to the voltage level difference between the first and second external data signals 'Data+' and 'Data−'.

The fourth sense amplifier 410 can output the seventh offset signal 'offset4' at a high level and the eighth offset signal 'offsetb4' at a low level, when the voltage level of the first external data signal 'Data+' is higher than the voltage level of the second external data signal 'Data−'. In addition, the fourth sense amplifier 410 can output the seventh offset signal 'offset4' at a low level and the eighth offset signal 'offsetb4' at a high level when the voltage level of the second external data signal 'Data−' is higher than the voltage level of the first external data signal 'Data+'. Since the fourth sense amplifier 410 receives the fourth clock signal 'CLK4', having a phase advanced from a phase of the first clock signal 'CLK1' of the first sense amplifier 110, the fourth sense amplifier 410 may receive data prior to that of the first sense amplifier 110.

As a result, if the voltage levels of the first and second external data signals 'Data+' and 'Data−', input to the fourth sense amplifier 410, are different from the voltage levels of the first and second external data signals 'Data+' and 'Data−' input to the first sense amplifier 110, then the first sense amplifier 110 can generate the first and second sense signals 'SA_out1' and 'SA_outb1' within a shorter time than the case in which the same data are input to the fourth sense amplifier 410 and the first sense amplifier 110. In other words, when the pattern of the first and second external data signals 'Data+' and 'Data−' is changed, the first sense amplifier 110 can generate the first and second sense signals 'SA_out1' and 'SA_outb1' within a shorter time than a case in which the pattern of the first and second external data signals 'Data+' and 'Data−' is not changed.

As shown in FIG. 2, the second sense amplifier 210 can receive the first and second sense signals 'SA_out1' and 'SA_outb1' of the first sense amplifier 110 as the first and second offset signals 'offset1' and 'offsetb1'. Accordingly, when the pattern of the first and second data signals 'Data+' and 'Data−' is changed, the second sense amplifier 210 can generate the third and fourth sense signals 'SA_out2' and 'SA_outb2'. In this case, the second sense amplifier 210 can generate the third and fourth sense signals 'SA_out2' and 'SA_outb2' within a shorter time than a case in which the pattern of the first and second external data signals 'Data+' and 'Data−' is not changed.

The third and fourth sense amplifiers 310 and 410 can generate their respective sense signals 'SA_out3', 'SA_outb3', 'SA_out4', and 'SA_outb4' when the pattern of the first and second external data signals 'Data+' and 'Data−' is changed within a shorter time than when the pattern is not changed.

Generating the first to eighth sense signals 'SA_out1', 'SA_outb1', 'SA_out2', 'SA_outb2', 'SA_out3', 'SA_outb3', 'SA_out4', and 'SA_outb4' within a shorter time when the pattern of the first and second data signals 'Data+' and 'Data−' is changed than when the pattern is not changed, means the transition of the first to eight sense signals 'SA_out1', 'SA_outb1', 'SA_out2', 'SA_outb2', 'SA_out3', 'SA_outb3', 'SA_out4', and 'SA_outb4' to a high level or a low level within a shorter time. In other words, this means that the setup time of the first to eighth sense signals 'SA_out1', 'SA_outb1', 'SA_out2', 'SA_outb2', 'SA_out3', 'SA_outb3', 'SA_out4', and 'SA_outb4' can be shortened, and the hold time thereof is lengthened. In contrast, the setup time of the first to eighth sense signals 'SA_out1', 'SA_outb1', 'SA_out2', 'SA_outb2', 'SA_out3', 'SA_outb3', 'SA_out4', and 'SA_outb4' is lengthened, and the hold time thereof is shortened when the pattern of the first and second external data signals 'Data+' and 'Data−' is not changed.

The receiver circuit of the semiconductor memory apparatus can fast generate sense signals of CMOS level (a setup time is shortened) if the pattern of data is not changed. If the pattern of the data is changed, then the time to detect and amplify the voltage difference of the data is ensured (the setup time is lengthened). However, in the receiver circuit, since the output of a sense amplifier provided in a present stage is received in a sense amplifier provided in a next stage as an offset signal, the offset signal can swing between the level of the grounding voltage and the level of an external voltage. Accordingly, the setup time of the output signal of the sense amplifier can be excessively shortened or lengthened according to the voltage level of the offset signal, and the hold time of the output signal can also be excessively lengthened or shortened according to the voltage level of the offset signal.

Therefore, the receiver circuit, according to one embodiment described herein, cannot control the setup time and the hold time of the output signal thereof, so that the receiver circuit may not be adapted for a predetermined system even when the system requires the receiver circuit to control the setup time and the hold time. However, another embodiment described herein, can solve the above problem.

Figure 4:
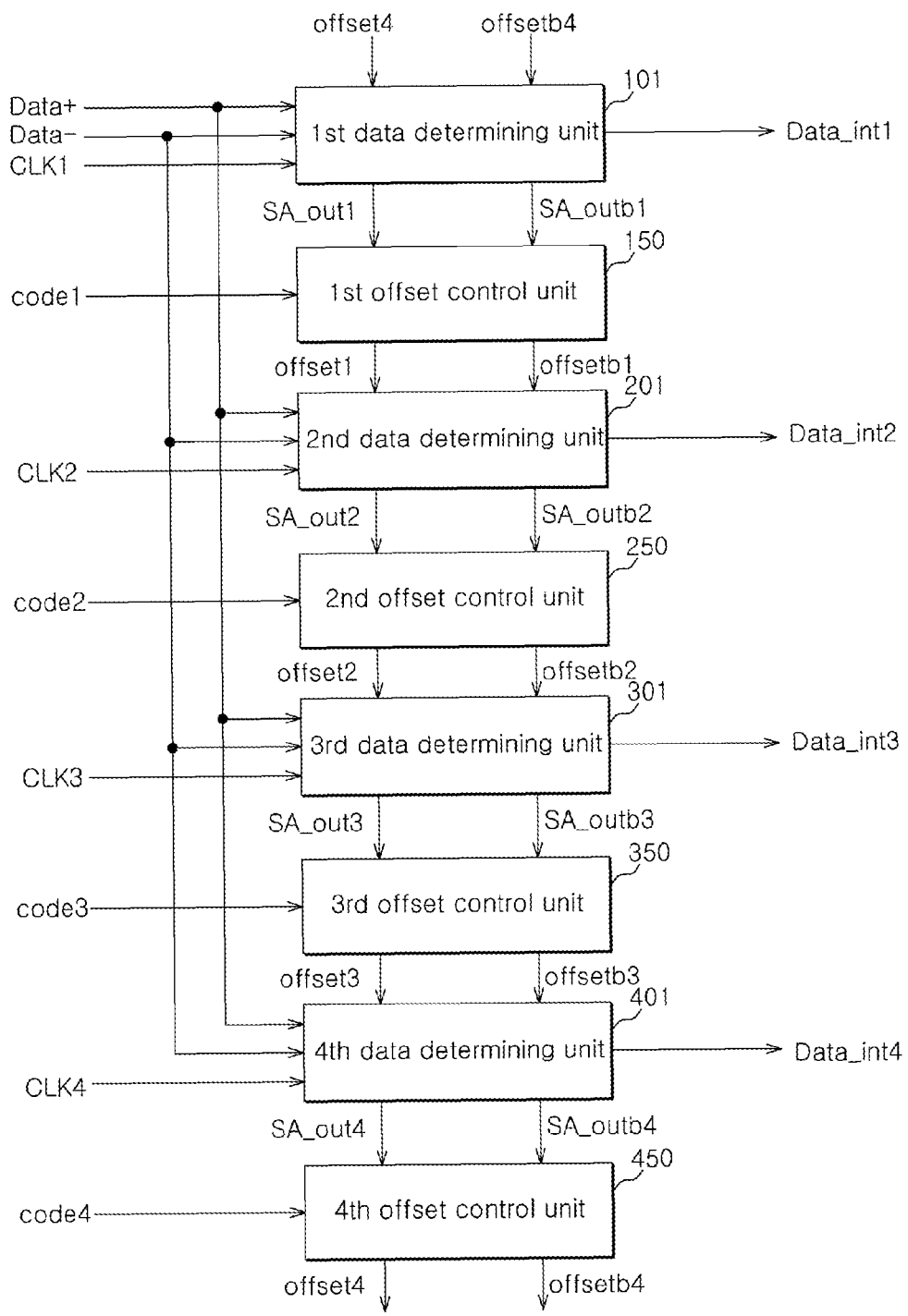
FIG. 4 is a block diagram showing a receiver circuit of a semiconductor memory apparatus according to another embodiment described herein.

FIG. 4 is a block diagram showing a receiver circuit of a semiconductor memory apparatus according to another embodiment described herein. As shown in FIG. 4, a receiver circuit 600 according to another embodiment described herein can include first to fourth data determining units 101 to 401, and first to fourth offset control units 150 to 450.

The first data determining unit 101 can detect and amplify a voltage level difference between first data signals 'Data+' and second data 'Data−' in response to a first clock signal 'CLK1' and can generate first and second sense signals 'SA_out1' and 'SA_outb1'. The first data determining unit 101 can generate the first internal data signal 'Data_init1' in response to the first and second sense signals 'SA_out1' and 'SA_outb1'.

The second data determining unit 201 can detect and amplify the voltage level difference between the first data signal 'Data+' and second data signal 'Data−' in response to a second clock signal 'CLK2' and can generate the third and fourth sense signals 'SA_out2' and 'SA_outb2'. The second data determining unit 201 can generate second internal data signal 'Data_init2' in response to the third and fourth sense signals 'SA_out2' and 'SA_outb2'.

The third data determining unit 301 can detect and amplify the voltage level difference between the first data signal 'Data+' and second data signal 'Data−' in response to a third clock signal 'CLK3' and can generate fifth and sixth sense signals 'SA_out3' and SA_outb3. The third data determining unit 301 can generate third internal data signal 'Data_init3' in response to the fifth and sixth sense signals 'SA_out3' and 'SA_outb3'.

The fourth data determining unit 401 can detect and amplify the voltage level difference between the first data signal 'Data+' and second data signal 'Data−' in response to a fourth clock signal 'CLK4' and can generate the seventh and eighth sense signals 'SA_out4' and 'SA_outb4'. The fourth data determining unit 401 can generate the fourth internal data signal 'Data_init4' in response to the seventh and eighth sense signals 'SA_out4' and 'SA_outb4'. A phase difference of 90 can exist between the first and second clock signals 'CLK1' and 'CLK2', between the second and third clock signals 'CLK2' and 'CLK3', between the third and fourth clock signals 'CLK3' and 'CLK4', and between the fourth and first clock signals 'CLK4' and 'CLK1'. Furthermore, each of the first to fourth data determining unit 101 to 401 can include one sense amplifier and one latch unit similar to the structure shown in FIG. 2. In addition, the sense amplifier can have the same structure as that shown in FIG. 3.

The first offset control unit 150 can control voltage levels of the first and second sense signals 'SA_out1' and 'SA_outb1' according to a first code 'code1' and can output first and second offset signals 'offset1' and 'offsetb1'. At this time, the first and second offset signals 'offset1' and 'offsetb1' can be supplied to the second data determining unit 201.

The second offset control unit 250 can control the voltage levels of the third and fourth sense signals 'SA_out2' and 'SA_outb2' according to a second code 'code2' and can output third and fourth offset signals 'offset2' and 'offsetb2'. At this time, the third and fourth offset signals 'offset2' and 'offsetb2' can be supplied to the third data determining unit 301.

The third offset control unit 350 can control the voltage levels of the fifth and sixth signals 'SA_out3' and 'SA_outb3' according to a third code 'code3' and can output fifth and sixth offset signals 'offset3' and 'offsetb3'. At this time, the fifth and sixth offset signals 'offset3' and 'offsetb3' are supplied to the fourth data determining unit 401.

The fourth offset control unit 450 can control voltage levels of the seventh and eighth signals 'SA_out4' and 'SA_outb4' according to a fourth code 'code4' and can output seventh and eighth offset signals 'offset4' and 'offsetb4'. At this time, the seventh and eighth offset signals 'offset4' and 'offsetb4' can be supplied to the first data determining unit 101. The values of the first to fourth codes 'code1' to 'code4' may be set by a user or a mode register setting signal.

The first to fourth offset control units 150 to 450 can have the same internal structure in which the voltage levels of sense signals are controlled according to a code to generate the offset signal. In this regard, the structure of the first offset control unit 150 will be representatively described, and the details of the second to fourth offset control units 350 to 450 will be omitted.

Figure 5:
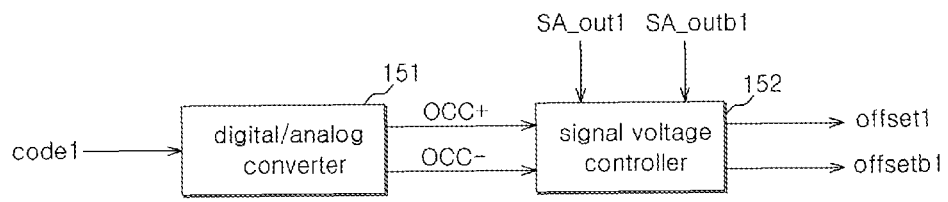
FIG. 5 is a block diagram showing a first offset control unit that can be included in the circuit of FIG. 4.

FIG. 5 is a block diagram showing a first offset control unit that can be included in the circuit of FIG. 4. As shown in FIG. 5, the first offset control unit 150 can include a digital/analog converter 151 and a signal voltage controller 152. The digital/analog converter 151 can determine a level of a first code voltage OCC+ and a level of a second code voltage OCC− in response to the first code 'code1'.

The signal voltage controller 152 can determine the level of the first and second offset voltages 'offset1' and 'offsetb1' in response to the voltage level of the first and second sense signals 'SA_out1' and 'SA_outb1' and the first and second code voltages OCC+ and OCC−.

Figure 6:
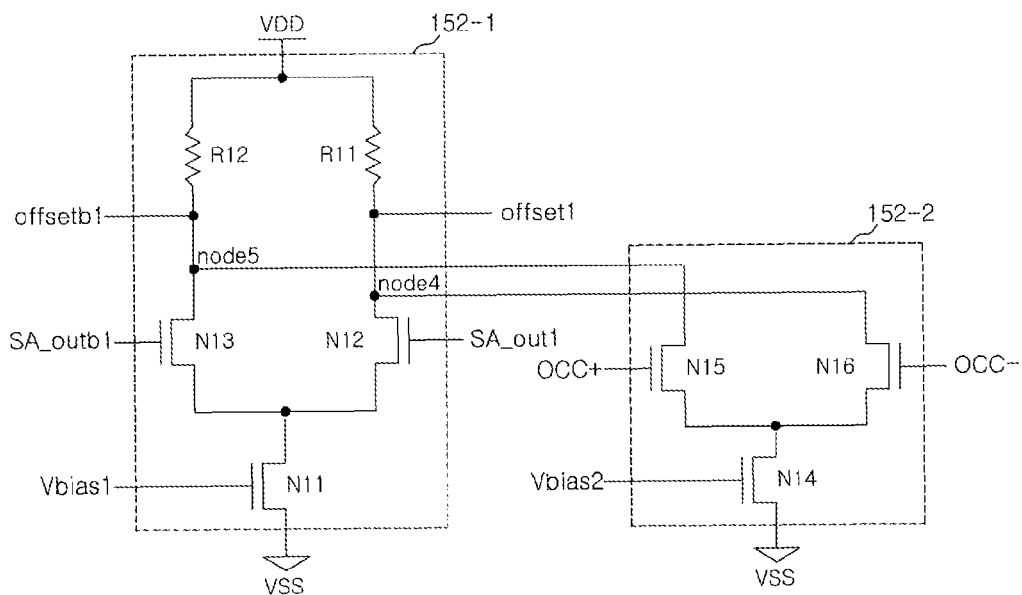
FIG. 6 is a detailed circuit diagram showing the signal voltage control unit that can be included in the circuit of FIG. 5.

FIG. 6 is a detailed circuit diagram showing the signal voltage control unit that can be included in the circuit of FIG. 5. As shown in FIG. 6, the signal voltage controller 152 can include an offset signal generating unit 152-1 and a voltage dropping unit 152-2.

The offset signal generating unit 152-1 can include first and second resistors R11 and R1 and fourteenth to sixteenth transistors N11 to N13. The fourteenth N11 can have a gate receiving a first bias voltage Vbias1 and a source connected to a grounding terminal VSS. The fifteenth transistor N12 can have a gate receiving the first sense signal 'SA_out1' and a source connected to a drain of the fourteenth transistor N11. The sixteenth transistor N13 can have a gate receiving the second sense signal 'SA_outb1' and a source connected to the drain of the fourteenth drain N11. The first resistor R11 can have a first terminal receiving an external voltage VDD and a second terminal connected to a drain of the fifteenth transistor N12. The second resistor R12 can have a first terminal receiving the external voltage VDD and a second terminal connected to a drain of the sixteenth transistor N13. A node linking the first resistor R11 with the fifteen transistor N12 is called a fourth node node4, and a voltage level of the fourth node node 4 can be output as the voltage level of the first offset signal 'offset1'. A node linking the second resistor R12 with the sixteenth transistor N13 is called a fifth node node5, and a voltage level of the fifth node node5 can be output as the voltage level of the second offset signal 'offsetb1'.

The voltage dropping unit 152-2 can include seventeenth to nineteenth transistors N14 to N16. The seventeenth transistor N14 can have a gate receiving a second bias voltage 'Vbias2' and a source connected to the grounding terminal VSS. The eighteenth transistor N15 can have a gate receiving the first code voltage OCC+, a source connected to a drain of the seventeenth transistor N14, and a drain connected to the fifth node node5. The nineteenth transistor N16 can have a gate receiving the second code voltage OCC−, a source connected to the drain of the seventeenth transistor N14, and a drain connected to the fourth node node4.

The signal voltage controller 152, having the above structure, can output the voltage levels of the fourth and fifth nodes node4 and node5 as the voltage levels of the first and second offset signals 'offset1' and 'offsetb1'. In more detail, if the fifteenth transistor N12 is turned off, then the voltage level of the fourth node node4 can be determined according to a level of the second code voltage OCC−. The voltage level of the fourth node node4, which has been determined according to the level of the second code voltage OCC−, may be lowered according to the turn-on state of the fifteenth transistor N12. Meanwhile, if the sixteenth transistor N13 is turned off, then the voltage level of the fifth node node5 can be determined according to a level of the first code voltage OCC+. The voltage level of the fifth node node5, which has been determined according to the level of the first code voltage OCC+, may be lowered according to a level of the first bias voltage Vbias1 if the sixteenth transistor N13 is turned on. Accordingly, the voltage dropping unit 152-2 can determine the maximum voltage levels of the first and second offset signals 'offset1' and 'offsetb1'. In addition, the offset signal generating unit 152-1 can determine the minimum voltage levels of the first and second offset signals according to the voltage levels of the first and second sense 'SA_out1' and 'SA_outb1'.

As a result, the first offset control unit 150 can drop the maximum voltage levels of the first and second offset signals 'offset1' and 'offsetb1', determined according to the code value of the first code 'code1', into the minimum voltage levels determined according to the first and second sense signals 'SA_out1' and 'SA_outb1'. Accordingly, the first offset control unit 150 can generate the first and second offset signals 'offset1' and 'offsetb1' swinging between the maximum level and the minimum level determined by a user or the mode register setting signal in response to the first and second sense signals 'SA_out1' and 'SA_outb1'.

Different from the previous embodiment, the receiver circuit 600 can include the first to fourth offset control units 150 to 140. The first offset control unit 150 can apply the first and second offset signals 'offset1' and 'offsetb1', which can swing between the maximum level and the minimum level determined by a user or a mode register setting signal in response to the first and second sense signals 'SA_out1' and 'SA_outb1', to the second data determining unit 201. In this case, the first and second signals 'SA_out1' and 'SA_outb1' can be generated from the first data determining unit 101.

The second offset control unit 250 can apply the third and fourth offset signals 'offset2' and 'offsetb2', which can swing between the maximum level and the minimum level determined by the user or the mode register setting signal in response to the third and fourth sense signals 'SA_out2' and 'SA_outb2', to the third data determining unit 301. In this case, the third and fourth sense signals 'SA_out2' and 'SA_outb2' can be generated from the second data determining unit 201.

The third offset control unit 350 can apply the fifth and sixth offset signals 'offset3' and 'offsetb3', which can swing between the maximum level and the minimum level determined by the user or the mode register setting signal in response to the fifth and sixth sense signals 'SA_out3' and 'SA_outb3', to the fourth data determining unit 401. In this case, the fifth and sixth sense signals 'SA_out3' and 'SA_outb3' can be generated from the third data determining unit 301.

The fourth offset control unit 450 can apply the seventh and eighth offset signals 'offset4' and 'offsetb4', which can swing between the maximum level and the minimum level determined by the user or the mode register setting signal in response to the seventh and eighth sense signals 'SA_out4' and 'SA_outb4', to the fifth data determining unit 501. In this case, the seventh and eighth sense signals 'SA_out4' and 'SA_outb4' can be generated from the fourth data determining unit 401.

Therefore, the receiver circuit 600, according to another embodiment described herein, can include an offset control unit which can be configured to control the maximum and minimum levels of an offset signal to be applied to a data determining unit, thereby can adjust the setup time and the hold time of data output from the data determining unit.

While certain embodiments have been described above, it will be understood that the embodiments described are by way of example only. Accordingly, the descriptions herein should not be limited based on the described embodiments. Rather, the descriptions herein should only be limited in light of the claims that follow when taken in conjunction with the above description and accompanying drawings.

What is claimed is:

1. A receiver circuit of a semiconductor memory apparatus, the receiver circuit comprising:
    a first data determining unit configured to detect and amplify a voltage level difference between first and second external data to generate first and second sense signals and for generating first internal data in response to the first and second sense signals;
    a first offset control unit configured to generate first and second offset signals in response to the first and second sense signals, the first and second offset signals configured to swing between a maximum voltage level and a minimum voltage level determined based on a first code;
    a second data determining unit configured to detect and amplify the voltage level difference between the first and second external data to generate third and fourth sense signals and generate second internal data in response to the third and fourth sense signals; and
    a second offset control unit configured to generate third and fourth offset signals in response to the third and fourth sense signals, the third and fourth offset signals swinging between a maximum voltage level and a minimum voltage level determined based on a second code, wherein the first data determining unit is configured to determine setup time and hold time of the first internal data in response to the third and fourth offset signals, and wherein the second data determining unit is configured to determine setup time and hold time of the second internal data in response to the first and second offset signals.

2. The receiver circuit of claim 1, wherein the first offset control unit comprises:
    a first digital/analog converter configured to generate first and second code voltages in response to the first code; and
    a first signal voltage controller configured to generate the first and second offset signals having the maximum voltage level in response to levels of the first and second code voltages and to generate the first and second offset signals having the minimum voltage level in response to the first and second sense signals.

3. The receiver circuit of claim 2, wherein the first signal voltage controller includes:
- a voltage dropping unit configured to generate the first and second offset signals having the maximum voltage level in response to the levels of the first and second code voltages; and
- an offset signal generating unit configured to generate the first and second offset signals having the minimum voltage level in response to the first and second sense signals.

4. The receiver circuit of claim 3, wherein the voltage dropping unit is further configured to generate the first and second offset signals having the maximum voltage level by dropping an external voltage in response to the first and second code voltages.

5. The receiver circuit of claim 3, wherein the offset signal generating unit is further configured to generate the first and second offset signals having the minimum voltage level by dropping the maximum voltage level of the first and second offset signals in response to the first and second sense signals.

6. The receiver circuit of claim 2, wherein the second offset control unit comprises:
- a second digital/analog converter configured to generate third and fourth code voltages in response to the second code; and
- a second signal voltage controller configured to generate the third and fourth offset signals having the maximum voltage level in response to levels of the third and fourth code voltages and to generate the third and fourth offset signals having the minimum voltage level in response to the third and second fourth signals.

7. The receiver circuit of claim 6, wherein the second signal voltage controller includes:
- a voltage dropping unit configured to generate the third and fourth offset signals having the maximum voltage level in response to the levels of the third and fourth code voltages; and
- an offset signal generating unit configured to generate the third and fourth offset signals having the minimum voltage level in response to the third and fourth sense signals.

8. The receiver circuit of claim 7, wherein the voltage dropping unit is further configured to generate the third and fourth offset signals having the maximum voltage level by dropping an external voltage in response to the third and fourth code voltages.

9. The receiver circuit of claim 7, wherein the offset signal generating unit is further configured to generate the third and fourth offset signals having the minimum voltage level by dropping the maximum voltage level of the third and fourth offset signals in response to the third and fourth sense signals.

* * * * *